United States Patent [19]

Lorenze, Jr. et al.

[11] 4,286,278
[45] Aug. 25, 1981

[54] HYBRID MOSAIC IR/CCD FOCAL PLANE

[75] Inventors: Robert V. Lorenze, Jr., Westford; William J. White, Chelmsford, both of Mass.

[73] Assignee: Honeywell Inc., Minneapolis, Minn.

[21] Appl. No.: 67,244

[22] Filed: Aug. 16, 1979

Related U.S. Application Data

[62] Division of Ser. No. 829,745, Sep. 1, 1977, Pat. No. 4,197,633.

[51] Int. Cl.³ .............................................. H01L 27/14
[52] U.S. Cl. ...................................... 357/30; 357/24; 357/61; 250/332
[58] Field of Search ............................ 357/30, 24, 61; 250/332

[56] References Cited

U.S. PATENT DOCUMENTS

| 3,883,437 | 5/1975 | Nummedal | 250/332 |
|---|---|---|---|
| 4,093,957 | 6/1978 | King | 357/24 |
| 4,132,999 | 1/1979 | Maillé | 357/30 |
| 4,206,470 | 6/1980 | White | 357/30 |

Primary Examiner—Martin H. Edlow
Attorney, Agent, or Firm—Theodore F. Neils

[57] ABSTRACT

A hybrid mosaic IR/CCD focal plane structure has high detector element packing densities which may be achieved using cost effective planar processing technology. The focal plane structure preferably includes an insulator layer over a silicon substrate which contains integrated circuit CCD signal processing circuitry. A mosaic photovoltaic (Hg,Cd)Te detector array is fabricated on the insulator layer. The photosignals from the detector array are coupled to the CCD circuitry by thin film electrical interconnects together with contact pads which extend through the insulator layer and are exposed at the surface of the insulator layer.

19 Claims, 9 Drawing Figures

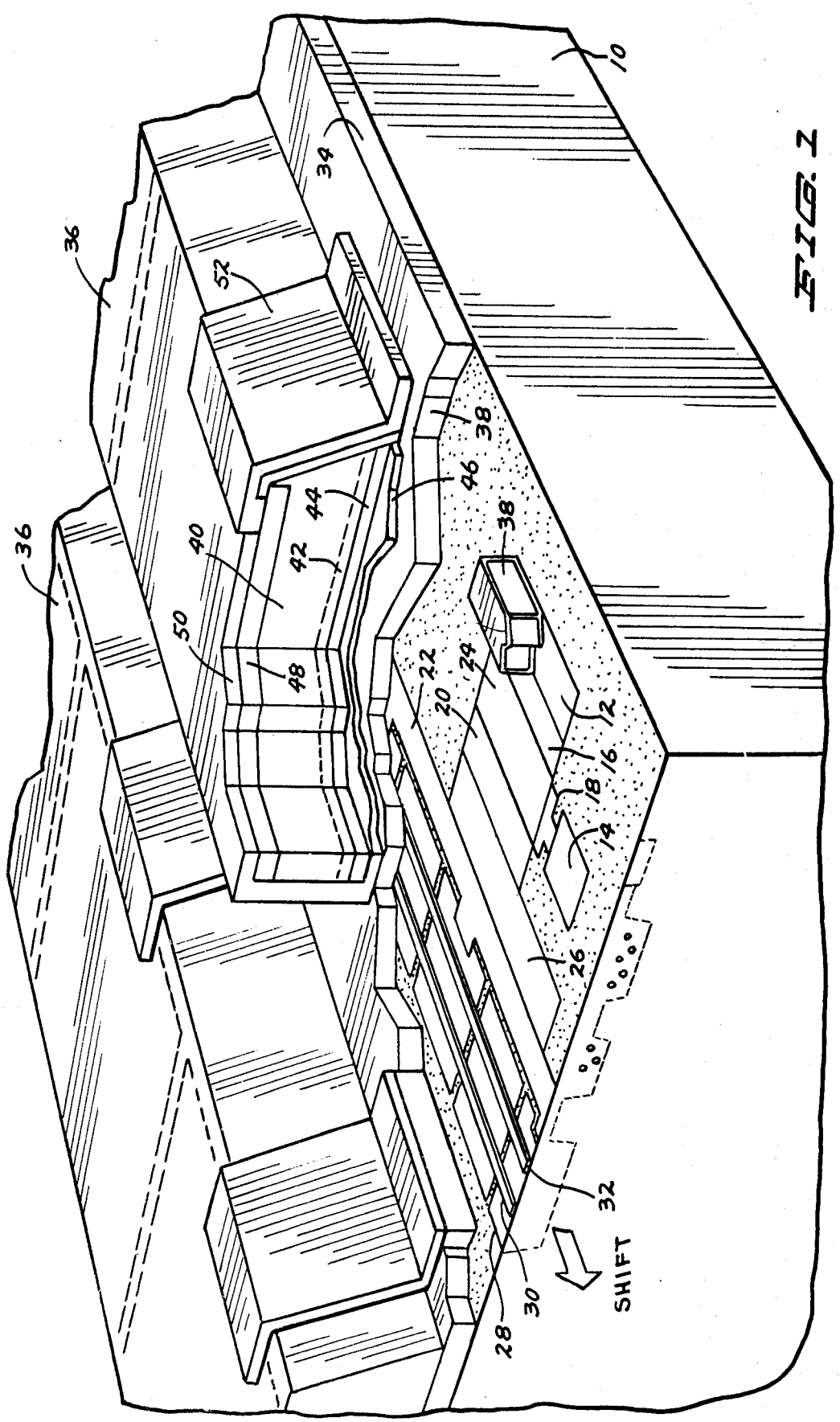

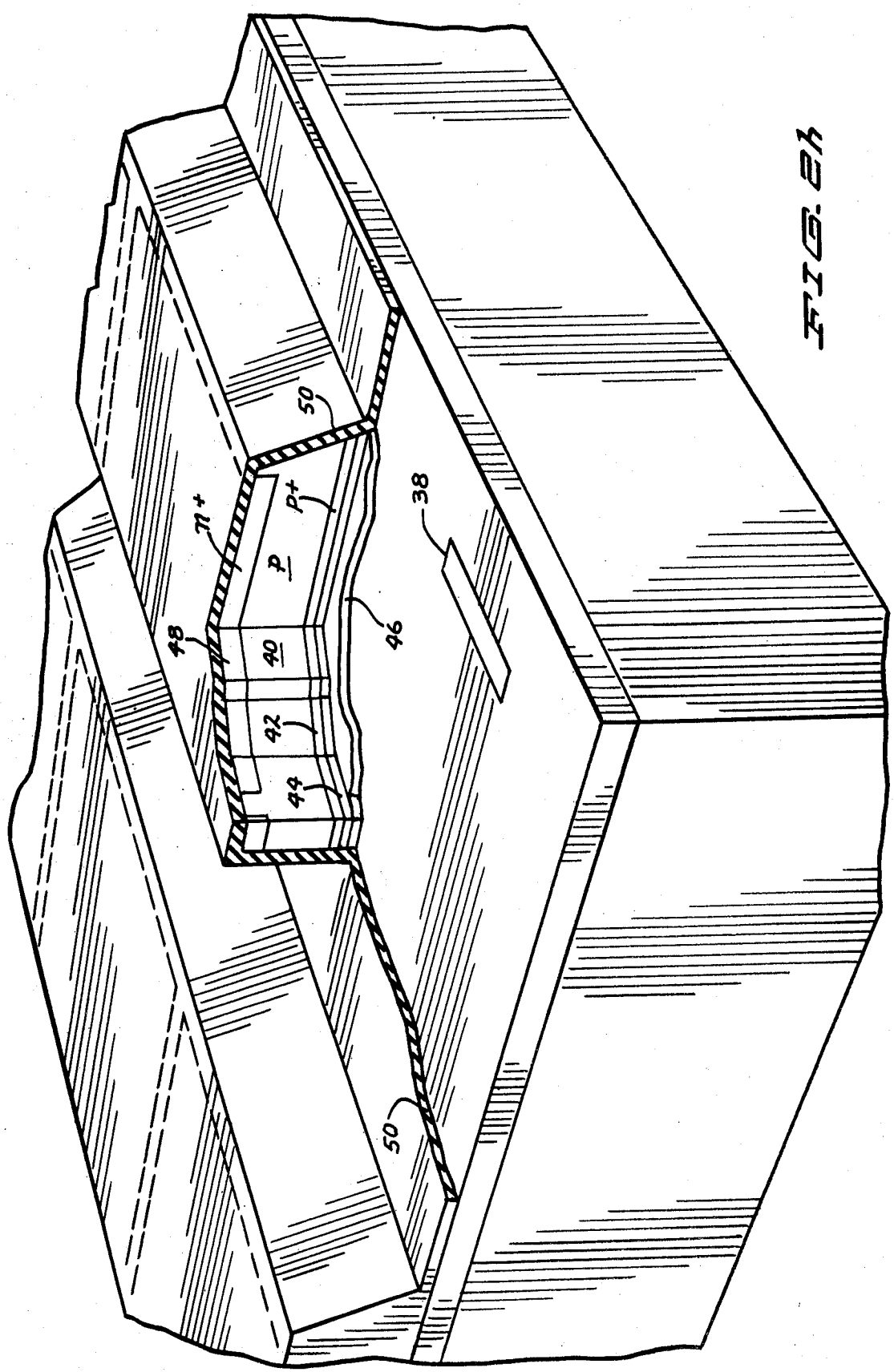

HYBRID MOSAIC IR/CCD FOCAL PLANE

This is a division of application Ser. No. 829,745, filed Sept. 1, 1977 now U.S. Pat. No. 4,197,633.

REFERENCE TO CO-PENDING APPLICATIONS

Reference is hereby made to co-pending patent applications by R. V. Lorenze, Jr. entitled "Durable Insulating Protective Layer for Hybrid CCD/Mosaic IR Detector Array" and by W. J. White entitled "Thin Film Interconnect for Multicolor IR/CCD", which were filed on even date with the present application and which are assigned to the same assignee as the present application. Both co-pending applications disclose but do not claim methods and structures which are specifically disclosed and claimed in the present application.

In the co-pending application by R. V. Lorenze, Jr., a preferred method of forming the contact pads and insulator layer utilized in the present invention is disclosed and claimed. This method is also disclosed in the present application as the preferred method for forming the contact pads and insulator layer, although the present invention may also use other methods for forming the contact pads and insulator layer.

The co-pending application by W. J. White discloses and claims a thin film interconnect for hybrid IR/CCD structures. This thin film interconnect is particularly advantageous in the multicolor IR/CCD structure described in the White application, but it may also be used as an alternative to the thin film interconnects shown in the present application.

BACKGROUND OF THE INVENTION

The present invention relates to electromagnetic radiation sensor systems. In particular, the present invention relates to hybrid infrared focal planes.

Previous designs of cryogenically cooled infrared focal planes can be characterized by a limited number of photodetector elements, an absence of preamplifiers or other signal processing elements, and a large complement of signal leads. Preamplification and other signal processing is carried out external to the Dewar. The complexity of the focal planes has been limited by the number of signal leads which can be routed from inside the Dewar, through vacuum seals, to the associated electronics outside of the Dewar.

Recent developments in semiconductor technology have led to the feasibility of more complex infrared system focal planes, with more sensitivity, higher resolution, higher data rates and greater reliability. These developments include advances in microelectronics, especially in charge transfer devices, MOS technology, and large scale integration.

The advent of charge transfer devices and their supporting technology introduces several major benefits. First, it is now possible to consider carrying out a variety of signal processing tasks in situ on or near the focal plane. Second, the multiplexing capability of charge transfer devices permits a dramatic reduction in the number of leads leaving the focal plane.

The integration of infrared detectors and integrated circuit signal processors on the focal plane, therefore, reduces the number of electrical feedthroughs and decreases the system complexity. Higher system performance becomes possible, along with considerable reduction in overall cost. An example of a proposed infrared detector/integrated circuit focal plane is shown in U.S. Pat. No. 3,883,437 by K. Nummedal et al.

The development of hybrid focal planes containing both infrared detectors and associated signal processing, however, presents several technical challenges. First, the typical infrared detector materials are mercury cadmium telluride, lead tin telluride, lead selenide telluride, and indium antimonide. The signal processing portions of the hybrid focal plane, however, will typically be silicon because the silicon technology is far more advanced than those of the typical infrared detector materials. In addition, the larger bandgap of silicon provides certain advantages over the narrower bandgaps of the typical infrared detector materials. The design of a hybrid focal plane, therefore, must accomodate infrared detectors and signal processors which are formed from different semiconductor materials.

Second, it is highly desirable to provide very high packing density of photodetectors on the focal plane. This complicates the interconnections of the photodetectors to the associated signal processing circuitry.

Third, since the photodetectors and the signal processing circuitry will be processed at different times, it is important that the processing of the infrared detectors does not adversely affect previously formed solid state signal processing circuitry, or vice versa.

SUMMARY OF THE INVENTION

The present invention is a hybrid focal plane structure together with highly advantageous methods of forming the structure. The hybrid focal plane includes a semiconductor substrate having solid state signal processing circuitry formed therein. An insulator layer covers the surface of the semiconductor substrate and provides a surface on which detector fabrication can take place. A plurality of rows of contact pads are exposed at the insulator surface and extend downward through the insulator layer to provide electrical contact to the solid state signal processing circuitry. A plurality of rows of photodetector material are mounted on the insulator layer adjacent rows of contact pads. Individual detectors are formed in each row of detector material, and interconnection is provided between the individual detectors and individual contact pads in the adjacent row of contact pads.

This configuration has several advantages. First, it is compatible with different materials for the semiconductor substrate and infrared detectors. Second, it allows for very high packing densities of detectors. Third, the signal processing circuitry is protected from damage by the insulator layer while the detector material is mounted on the insulator layer and individual detectors are fabricated and interconnected to the solid state signal processing circuitry. Fourth, the configuration allows the use of cost effective and reliable planar processing technology for fabrication of the infrared detectors. Fifth, the present invention permits the fabrication of arrays of extremely thin infrared detectors, which may provide significant improvement in detector performance.

BRIEF DESCRIPTION OF THE DRAWINGS

FIG. 1 shows a partial cut-away view of one embodiment of the hybrid focal plane of the present invention.

FIGS. 2a–2h show steps in the fabrication of the hybrid focal plane shown in FIG. 1.

DETAILED DESCRIPTION OF THE PREFERRED EMBODIMENTS

Figure 2A:
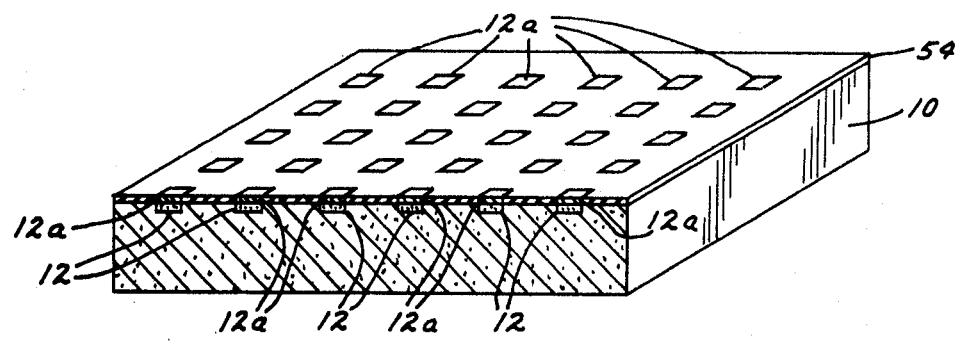

The hybrid mosaic IR/CCD focal plane structure of the present invention allows high detector element packing densities (50–90%) to be achieved using a cost effective planar processing technology. In its preferred embodiments, the configuration includes a mosaic photovoltaic (Hg,Cd)Te detector array which has been fabricated directly on an insulator layer covering a silicon substrate. The silicon substrate contains integrated CCD processing circuitry.

FIG. 1 shows a preferred embodiment of the present invention. In FIG. 1, a portion of the detector array has been removed to expose the internal structure of the focal plane, including the CCD signal processing circuitry.

The IR/CCD hybrid focal plane shown in FIG. 1 includes a silicon substrate 10 on which CCD signal processing circuitry is formed. The CCD signal processing circuitry is on or near the surface of silicon substrate 10.

In the embodiment shown in FIG. 1, the CCD signal processing circuitry includes sources 12 and 14, gates 16, 18, 20, and 22, charge wells 24 and 26, shift registers 28, and clock lines 30 and 32. Photosignals from a detector of the detector array are received at source 12. The signals are transferred from source 12 by gates 16, 20, and 22 through charge wells 24 and 26 to shift register 28. Clock lines 30 and 32 cause charge to be advanced through shift register 28 in the direction indicated by the arrow and the word "shift". In the embodiment shown in FIG. 1, the signal processing circuitry operates in the "time delay and integrate (TDI)" mode. In this mode, photosignals from a row of detectors are fed into shift register 28 in such a manner that the signals from the individual detectors of the row are added. The TDI mode provides an improvement in signal-to-noise ratio of approximately $N^{\frac{1}{2}}$, where N is the number of detectors in a row.

The specific configuration of the signal processing circuitry will, of course, depend on the particular application of the hybrid structure. Operating modes other than the TDI mode (e.g. a multiplexing mode) may also be used advantageously with the structure of the present invention.

In the preferred embodiment shown in FIG. 1, the CCD signal processing circuitry is formed near the top surface of semiconductor substrate 10 and is the "buried channel" type. The CCD is full passivated by the standard silicon dioxide passivation used with silicon integrated circuits.

In addition to the standard passivation on substrate 10, the present invention utilizes an insulator layer 34, which covers the standard passivation on the top surface of substrate 10 and provides a planar surface on which rows 36 of (Hg,Cd)Te detector material are formed. Electrical connection between the individual detector elements in rows 36 and the CCD circuitry is provided by contact pads 38. Contact pads 38 are metal pads which extend from sources 12 through insulator layer 34 and are exposed at the top surface of insulator layer 34. The spacing and size of contact pads 38 is consistent with the detector size and spacing in the hybrid structure.

A large number of individual detectors are formed in each row 36 of detector material. In the embodiment shown in FIG. 1, the detector material includes a bulk p type body 40 of (Hg,Cd)Te. Near the back surface, a p+ type layer 42 is formed. A common electrical ohmic contact for all detectors in a row is provided by p+ layer 42 together with metal layer 44 and conductive epoxy layer 46.

Individual photovoltaic infrared detectors have been formed in each row 36. These detectors are formed by n+ regions 48 near the top surface of the detector material. The dashed lines shown on the top surfaces of rows 36 delineate the individual n+ regions 48. As shown in FIG. 1, n+ regions 48 are separated from one another, thereby forming individual photovoltaic detectors.

A passivation layer 50 covers the top and side surfaces of each row 36 of detector material. Photosignals from the individual (Hg,Cd)Te photovoltaic detector elements are supplied to source elements 12 of the CCD signal processing circuitry by thin film interconnects 52, which interconnect n+ regions 48 with corresponding contact pads 38. As shown in FIG. 1, thin film interconnects 52 extend from contact pads 38 on the top surface of insulator 34, over the passivation layer 50 on a side surface of the detector and on to the top surface of the detector. A hole in passivation layer 50 has been provided to allow thin film interconnect 52 to make electrical contact to n+ region 48.

The structure shown in FIG. 1 may be fabricated by a process utilizing cost effective planar processing technology. In addition, the structure allows fabrication of very thin infrared detectors on top of a silicon CCD integrated circuit without damage to the integrated circuit or any of the signal processing circuitry contained in the circuit.

FIGS. 2a–2h illustrate steps in the preferred process of forming the hybrid IR/CCD of FIG. 1. FIGS. 2a–2d illustrate the specific method of forming insulator layer 34 and contact pads 38 which is disclosed and claimed in the previously mentioned co-pending application by R. V. Lorenze, Jr. Although FIGS. 2a–2d illustrate a preferred method, the present invention also may use other methods of forming insulator layer 34 and contact pads 38. The important requirement, as far as the present invention is concerned, is that the surface of the integrated circuit substrate 10 be covered by an insulator layer 34 and that rows of contact pads 38 be exposed at the surface of the insulator layer to provide electrical connection to the CCD circuitry in substrate 10.

FIG. 2a illustrates semiconductor substrate 10, which has been processed to form all of the required CCD signal processing circuitry. The CCD signal processing circuitry includes source diffusions 12 which are aligned in rows. As discussed previously, photosignals from the detector elements will be coupled to the CCD processing circuitry through source diffusions 12. The spacing and size of source diffusions 12 is consistent with the detector size and spacing.

As shown in FIG. 2a, the top surface of semiconductor substrate 10 is passivated by passivation layer 54. Passivation layer 54 is a standard passivation layer utilized with silicon integrated circuits and is typically a thin film of silicon dioxide. Thin metal contacts 12a are exposed at the top surface of passivation layer 54. Contacts 12a allow external electrical contact to source regions 12.

Figure 2B:
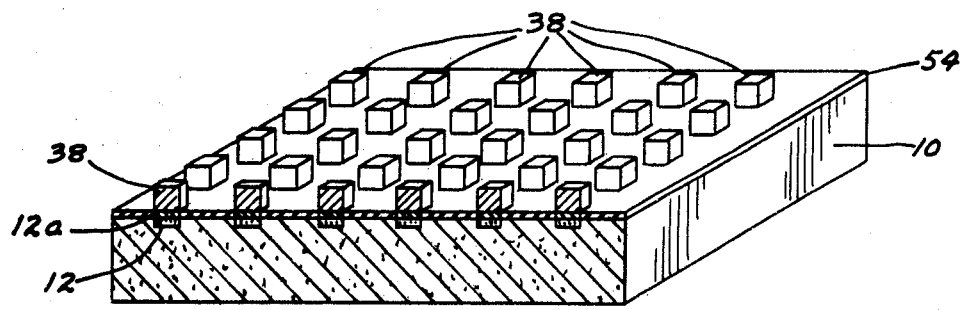

FIG. 2b shows contact pads 38, which have been plated on top of source contacts 12a. Contact pads 38 preferably have a thickness of between about 5 and about 15 microns. Contact pads 38 may be fabricated using photolithographic masking and metal electroplating techniques. Preferred materials for contact pads 38 include gold and nickel, which may be easily plated using standard plating techniques.

Figure 2C:
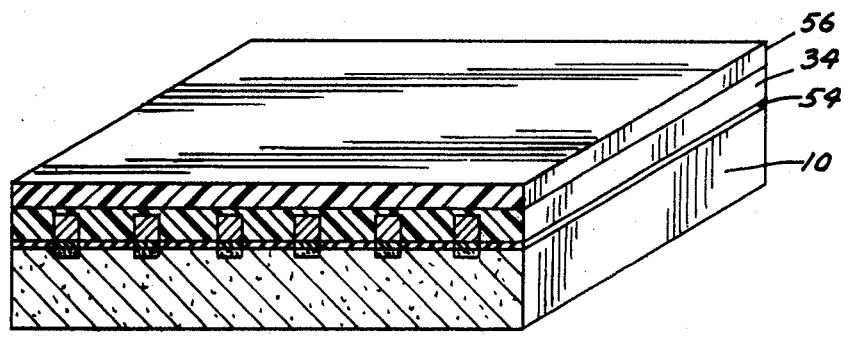

The next step in the process is illustrated in FIG. 2c. The top surface of semiconductor substrate 10 is coated with a layer of an insulator to form insulator layer 34. In the preferred embodiments, insulator layer 34 is formed by coating the top surface with a layer of insulating adhesive material so that plated contact pads 38 are completely covered. In one successful embodiment, the insulating adhesive material is a filled nonconducting epoxy which is customarily used in (Hg,Cd)Te detector fabrication. A thin, rigid temporary substrate 56 is then pressed down over the epoxy layer 34, and the structure is allowed to cure. Thin, rigid temporary substrate 56 is a material that can easily be lapped by conventional techniques and may, for example, be a plastic material or Irtran 2.

Figure 2D:
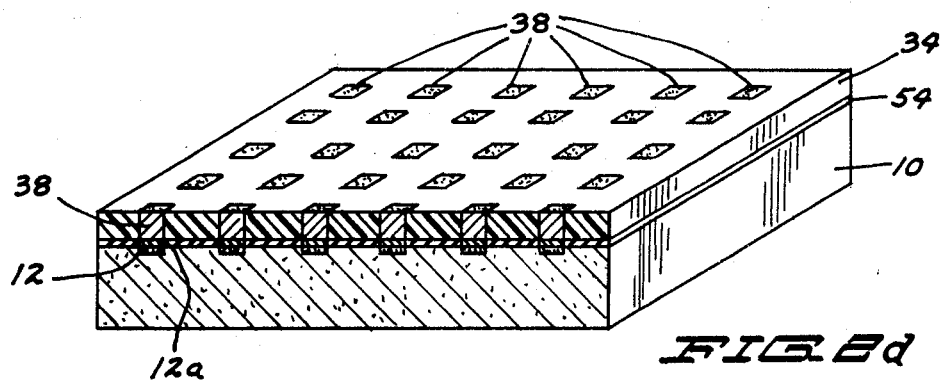

After the epoxy has cured, the structure shown in FIG. 2c is mounted on a lapping fixture and temporary substrate 56 is lapped away. The lapping continues until enough epoxy in layer 34 is removed so that the contact pads 38 are exposed. FIG. 2d shows the resulting structure. At this point, a durable thin insulator layer 34 has been established with its exposed surface flat and parallel to the plane of the silicon substrate 10. The preferred thickness of layer 34 is between about 5 microns and about 15 microns. Electrical access to the CCD signal processing circuitry in substrate 10 is provided by contact pads 38. Infrared sensitive photodetector material (such as (Hg,Cd)Te) can now be mounted and processed on the top surface of insulator layer 34 without exposing the signal processing circuitry in underlying silicon substrate 10 to mechanical or chemical damage during detector fabrication.

Figure 2E:
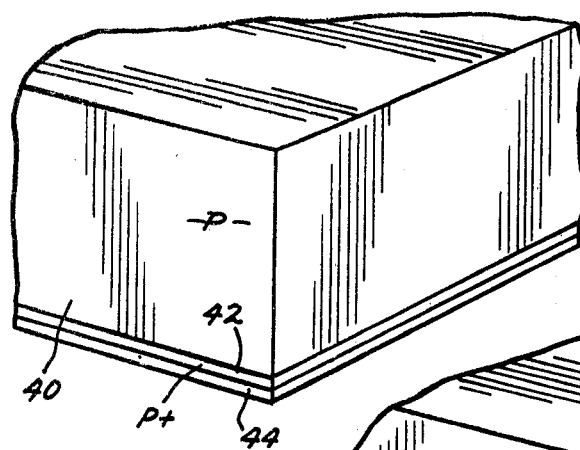

Once the insulating epoxy has been applied to the CCD surface and lapped down to expose source contact pads 38, it is ready to act as a substrate for (Hg,Cd)Te array processing. The first step in (Hg,Cd)Te processing is the backside preparation, as illustrated in FIG. 2e. A wafer of p type (Hg,Cd)Te 40 is selected using non-destructive test techniques, and one side is then lapped and chemically polished according to standard processing procedures. At this point, the processed back surface is ion implanted with an acceptor ion species (e.g. a column Vb ion such as As, P, or Sb) and subjected to an elevated temperature to form a p+ layer 42. The back surface is then coated with a thin film metal layer 44 which forms the (Hg,Cd)Te backside contact. Thin metal film 44 is preferably Ni or Sb.

Both the ion species used to form the p+ layer 42 and the metal used to form thin metal layer 44 must meet the following criteria: (1) they must act electrically as a p type impurities in (Hg,Cd)Te; and (2) they must be slow diffusers in (Hg,Cd)Te at temperatures up to approximately 300° C. In addition, the thin metal film 44 must provide ohmic (nonrectifying) contact to p type (Hg,Cd)Te.

Figure 2F:
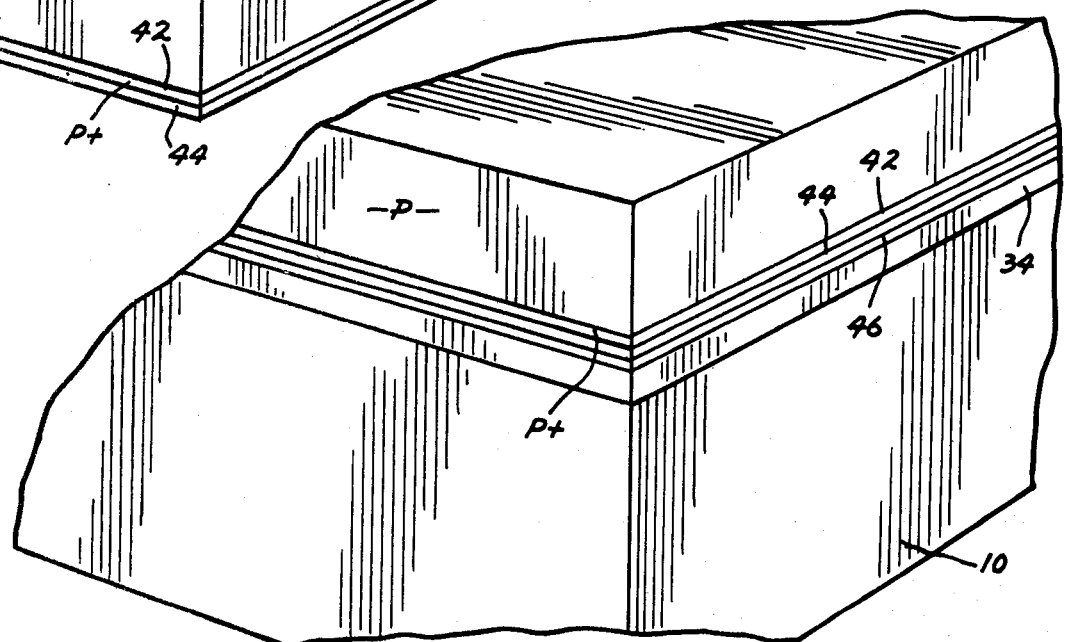

After thin metal film 44 has been deposited, the (Hg,Cd)Te is adhered metal side down to the top surface of insulator layer 34 with a thin (approximately 2 to 5 microns) conductive epoxy or with a low melting point solder. FIG. 2f shows the (Hg,Cd)Te body 40 bonded to insulator layer 34 by conductive epoxy layer 46. It is conductive epoxy layer 46 which (after detector delineation) provides separate backside contact to each individual row of detector elements of the hybrid mosaic array.

After (Hg,Cd)Te body 40 has been bonded to insulator layer 34, front side preparation of the (Hg,Cd)Te may be initiated. The first step in the process is a lap and chemical etch procedure which reduces the (Hg,Cd)Te body from an initial thickness of approximately 1 mm to a final thickness of approximately 10 to 12 microns. FIG. 2f shows (Hg,Cd)Te body after the lap and chemical etch procedure. At this point, the top side surface of (Hg,Cd)Te body 40 is flat and parallel to the top surface of CCD semiconductor substrate 10.

Figure 2G:
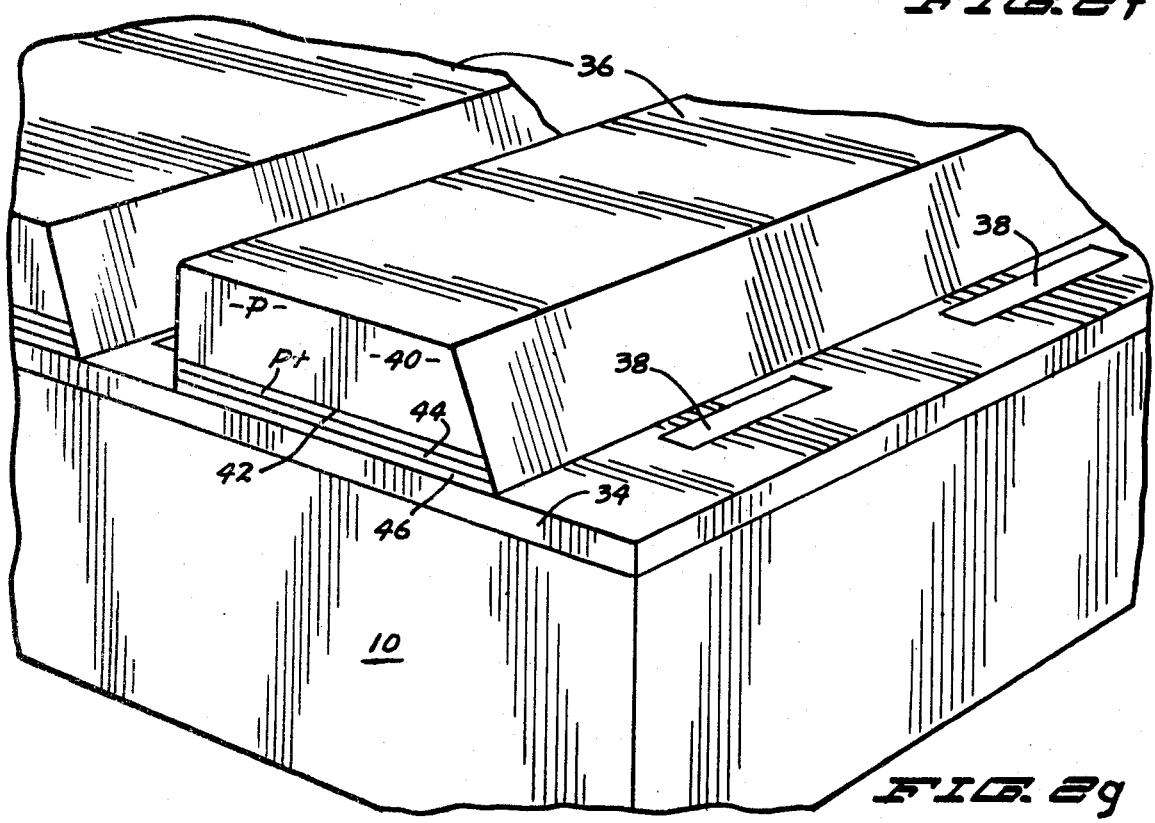

A photoresist pattern is then applied to the top surface of the (Hg,Cd)Te, and the (Hg,Cd)Te is spray-etch delineated such that rows 36 of rectangular shaped (Hg,Cd)Te bars are positioned above and between rows of plated up contact pads 38. With the photoresist mask still in place, a low pressure air abrasion tool is used to erode away the exposed portions of thin conductive epoxy layer 46 to expose contact pads 38 embedded in the insulating epoxy layer 34. It is insulating epoxy layer 34 which protects the CCD circuitry from damage during the air abrasion delineation procedure. FIG. 2g shows the structure after the spray-etch and air abrasion delineation procedure. Individual rows 36 of detector material have been formed from body 40.

After the (Hg,Cd)Te and conductive epoxy have been delineated, the (Hg,Cd)Te is given a final chemical etch to remove surface damage, and the entire array is blanket coated with an approximately 1000 Å thickness film of a dielectric passivation material such as ZnS. Passivation layer 50 is shown in FIG. 2h.

The structure is then ready for formation of a pn junction by ion implantation. The objective of this stage of the array processing is the formation of an n type region 48 in the p type (Hg,Cd)Te bulk 40 in order to form a photodiode. This is achieved by ion implantation of donor ions such as Cl, Br, F, I, Al or Si. In the preferred embodiments, donor ions are implanted through a photoresist mask such that the regions (Hg,Cd)Te not covered by the photoresist mask (i.e. the square areas delineated by dashed lines in FIG. 2h) are implanted while the resist covered regions are not. The energy of the ions is such that the ions cannot penetrate the relatively thick photoresist layer, but can pass through the thin ZnS passivation layer 50 and enter the (Hg,Cd)Te body. When Cl ions are utilized as the donor ion species, a subsequent anneal at 200° to 300° C. relieves implant damage and activates the Cl impurities to form an n type region 48 near the surface of p type bulk 40, thereby producing a pn junction photodiode.

At the stage in array fabrication shown in FIG. 2h, rows of detector elements have been delineated mechanically by physical removal of material (i.e. by spray-etching and air abrasion) while columns of detector elements have been delineated electrically by junction ion implantation. Each row of detector elements has a common backside contact which can be accessed through an exposed portion of conductive epoxy 46 at the end of each row.

The next stage, which is illustrated in FIG. 1, is to interconnect individual n type regions 48 of each pn junction to respective contact pads 38. This is preferably accomplished by means of a totally evaporated lead. A detailed description of preferred fabrication techniques for producing totally evaporated leads may be found in copending U.S. Pat. applications by R. V. Lorenze, Jr. and M. F. Young, Ser. Nos. 720,917 and 720,918 entitled "Method of Preparing Photodetector Array Elements" and "Photodetector Array Delineation Method", filed Sept. 9, 1976 and assigned to the same assignee as the present application.

Before interconnection between n type regions 48 and contact pads 38 can be accomplished, small regions of the passivation layer 50 must be removed. This is done by photoresist masking which exposes only those areas where the passivation layer 50 is to be removed. In addition corresponding areas of the passivation material must also be removed to expose the contact pads 38. In the embodiment shown in FIG. 1, all of that portion of passivation layer 50 which is between rows 36 has been removed. When the passivation layer is ZnS, an etch such as HCl may be used to dissolve the unwanted ZnS through the photoresist mask. The resist layer is then stripped away and the array is prepared for the interconnect metalization.

Several alternatives are available for the totally evaporated lead interconnect metalization. One alternative which is shown in FIG. 1 incorporates a beveling or edge contouring process in which the side surface over which the thin film interconnect metalization 52 traverses is sloped at an angle (for example, 45°) so that a favorable contour is created over which continuous metal thin films can be deposited. This beveling process, which is described in detail in the two previously mentioned patent applications by R. V. Lorenze, Jr. and M. F. Young, is usually done after the (Hg,Cd)Te body has been spray-etch delineated into rows 36. The beveling process has been used successfully to produce multielement high performance linear arrays with totally evaporated leads for applications (e.g. FLIRs) in which high reliability and cost effective fabrication techniques are required.

For mosaic array applications, however, where close spacing of detector elements is necessary, the beveling process uses up valuable space and may induce damage in adjacent rows of detectors. As a result, a modified "nonbevel" totally evaporated lead metalization may be utilized. Instead of beveling the side of (Hg,Cd)Te, the angle between the deposition source of the thin metal film and the plane of the array is changed from the standard 90° to a much lower angle (for example 45°). Either metal evaporation masks and resistance evaporation techniques or photolithography and sputter deposition may be used to produce the totally evaporated lead metalization.

Still another alternative in forming the thin film interconnects is shown in the previously mentioned co-pending application by W. J. White. The thin film interconnect disclosed in the White application is a planar interconnect and does not require a bevelled detector structure. It is, therefore, particularly useful in mosaic array structures.

The metal used for totally evaporated lead interconnect 52 is preferably Pb, although other metals such as Al may also be used. The metal selected must make ohmic contact to the n type (Hg,Cd)Te and should be a slow diffuser in (Hg,Cd)Te at temperatures up to about 300° C. In addition, the metal must make reliable contact with the metal used for contact pads 38.

The final structure of the hybrid IR/CCD focal plane of the present invention is shown in FIG. 1. One additional step in the fabrication process which is not shown in FIG. 1 or in FIGS. 2a–2h is the deposition of an antireflection coating over the entire array. The antireflection coating optimizes detector performance for particular infrared wavelengths.

In conclusion, the present invention provides several important advantages. First, the very high (50 to 90%) detector element packing densities obtainable. Second, the structure allows processing of the infrared detectors without damaging the signal processing circuitry. Third, the structure allows fabrication of the detector array by reliable and cost effective planar processing techniques. Fourth, the structure permits fabrication of extremely thin (e.g. 10 micron thickness) infrared detectors.

Although the present invention has been described with reference to preferred embodiments, workers skilled in the art will recognize that changes may be made in form and detail without departing from the spirit and scope of the invention. For example, although silicon has been described as the preferred semiconductor substrate material and (Hg,Cd)Te has been described as the preferred infrared detector material, other semiconductor materials may also be used. The specific configuration shown in the Figures and described in the specification utilizes a n+ on p photodiode structure, but it will be recognized that p+ on n photodiode structures may also be used. In addition, the present invention may also be utilized in conjunction with photoconductive infrared detectors or pyroelectric detectors.

The embodiments of the invention in which an exclusive property or right is claimed are defined as follows:

1. A photodetector system comprising:
   a semiconductor substrate having solid state signal processing circuitry therein;
   an insulator layer over a surface of the semiconductor substrate;
   a plurality of rows of contact pads projecting through the insulator layer to provide electrical contacts to the solid state signal processing circuitry;
   a plurality of rows of photodetector material mounted on the insulator layer, each row of photodetector material having front and back surfaces, a region of first conductivity type proximate the back surface, and a plurality of regions of second conductivity type separated from one another and proximate the front surface;
   first electrical contact means interposed between the back surface and the insulator layer for providing electrical contact to the region of first conductivity type; and
   second electrical contact means for providing electrical contact between the regions of second conductivity type and the contact pads in an adjacent row of contact pads.

2. The photodetector system of claim 1 wherein the second electrical contact means comprises:
   individual electrical interconnects between each region of second conductivity type and a corresponding contact pad in the adjacent row of contact pads.

3. The photodetector system of claim 2 and further comprising a passivation layer over the rows of photodetector material.

4. The photodetector system of claim 3 wherein the individual electrical interconnects comprise a thin metal film extending from the contact pad, over the passivation layer, to an exposed portion of the region of second conductivity type.

5. The photodetector system of claim 1 wherein the photodetector material is (Hg,Cd)Te and the semiconductor substrate is silicon.

6. The photodetector system of claim 5 wherein the first conductivity type is p-type and the second conductivity type is n-type.

7. The photodetector system of claim 6 wherein the first electrical contact means comprises:
- a p+ layer in the row of photodetector material proximate the back surface;
- a metal layer on the back surface and making ohmic contact to the p+ layer; and
- a conductive bonding material bonding the metal layer to the insulator layer.

8. The photodetector system of claim 7 wherein the conductive bonding material is exposed at the end of the row to allow electrical connection thereto.

9. The photodetector system of claim 7 wherein the metal layer is of the group consisting of Ni and Sb.

10. The photodetector system of claim 6 wherein the second electrical contact means comprises:
- individual metal thin film interconnects between each region of second conductivity type and a corresponding contact pad in the adjacent row of contact pads.

11. The photodetector system of claim 10 wherein the metal thin film interconnects make ohmic contact to n-type (Hg,Cd)Te.

12. The photodetector system of claim 11 wherein the metal thin film interconnects are of a metal from the group consisting of Pb and Al.

13. The photodetector system of claim 1 wherein the insulator layer has an essentially planar surface with the rows of contact pads surrounded by insulator material and exposed at the essentially planar surface.

14. A photodetector system comprising:
- a semiconductor substrate having solid state signal processing circuitry therein proximate a first surface;
- an insulator layer covering the first surface;
- a row of contact pads surrounded by the insulator layer and exposed at the surface of the insulator layer, the contact pads extending from the surface through the insulator layer to provide electrical contacts to the solid state signal processing circuitry;
- a row of photovoltaic detectors having back surfaces mounted on the surface of the insulator layer and having regions of first conductivity type proximate the back surfaces and regions of second conductivity type proximate front surfaces of the detectors, the row of photovoltaic detectors being aligned essentially parallel to the row of contact pads;
- a common electrical contact to the regions of first conductivity type of all photovoltaic detectors of the row thereof interposed between the back surfaces of the photovoltaic detectors and the insulator layer; and
- individual electrical interconnects between the region of second conductivity type of each photovoltaic detector and a corresponding contact pad in the row of contact pads.

15. The photodetector system of claim 14 wherein the photovoltaic detectors are (Hg,Cd)Te photovoltaic detectors.

16. The photodetector system of claim 15 wherein the common electrical contact comprises:
- a high conductivity layer of first conductivity type in the (Hg,Cd)Te photovoltaic detectors proximate the back surfaces;
- a metal layer on the back surfaces and making ohmic contact to the high conductivity layer; and
- a conductive bonding material bonding the metal layer to the essentially planar surface.

17. The photodetector system of claim 16 wherein the first conductivity type is p-type and the second conductivity type is n-type.

18. The photodetector system of claim 17 and wherein the individual electrical interconnects are metal thin film interconnects which make ohmic contact to n-type (Hg,Cd)Te.

19. The photodetector system of claim 18 and further comprising a passivation layer over at least a portion of the photovoltaic detectors and wherein each metal thin film interconnect extends from a contact pad, over the passivation layer, to an exposed portion of the region of second conductivity type.

* * * * *